US010960601B2

(12) United States Patent
Bruggeman et al.

(10) Patent No.: US 10,960,601 B2
(45) Date of Patent: Mar. 30, 2021

(54) THREE-DIMENSIONAL MODELING SYSTEM AND METHOD

(71) Applicant: BOND HIGH PERFORMANCE 3D TECHNOLOGY B.V., Enschede (NL)

(72) Inventors: Thomas Jonathan Bruggeman, Enschede (NL); Adrianus Bruggeman, Enschede (NL); Martijn Johannes Wölbers, Enschede (NL); Kevin Hendrik Jozef Voss, Enschede (NL); Bouwe Kuiper, Enschede (NL); Jan Teun Bartelds, Enschede (NL); Koendert Hendrik Kuit, Enschede (NL); Klaas Groen, Enschede (NL)

(73) Assignee: BOND HIGH PERFORMANCE 3D TECHNOLOGY B.V., Enschede (NL)

( * ) Notice: Subject to any disclaimer, the term of this patent is extended or adjusted under 35 U.S.C. 154(b) by 0 days.

(21) Appl. No.: 16/490,267

(22) PCT Filed: Mar. 2, 2018

(86) PCT No.: PCT/EP2018/055199
§ 371 (c)(1),
(2) Date: Aug. 30, 2019

(87) PCT Pub. No.: WO2018/158439
PCT Pub. Date: Sep. 7, 2018

(65) Prior Publication Data
US 2019/0381724 A1 Dec. 19, 2019

(30) Foreign Application Priority Data

Mar. 2, 2017 (NL) .................................... 2018455
May 17, 2017 (EP) .................................... 17171475

(51) Int. Cl.
*B29C 64/118* (2017.01)
*B33Y 10/00* (2015.01)
(Continued)

(52) U.S. Cl.
CPC .......... *B29C 64/118* (2017.08); *B29C 64/209* (2017.08); *B29C 64/393* (2017.08);
(Continued)

(58) Field of Classification Search
CPC .... B29C 64/209; B29C 64/118; B29C 64/393
See application file for complete search history.

(56) References Cited

U.S. PATENT DOCUMENTS

2012/0070523 A1  3/2012  Swanson et al.
2015/0097308 A1  4/2015  Batchelder et al.
(Continued)

*Primary Examiner* — Jacob T Minskey
*Assistant Examiner* — Virak Nguon
(74) *Attorney, Agent, or Firm* — Hudak, Shunk & Farine Co. LPA

(57) ABSTRACT

A three-dimensional modeling system for creating an object having a printhead having a tubular feed member and a nozzle having a nozzle outlet for dispensing modeling material. The tubular feed member having a feed channel for feeding the modeling material to the nozzle outlet. The system further having modeling material feeding means arranged at an end of the tubular feed member opposite of the nozzle, wherein the modeling material feeding means are arranged for exerting a pressure on the modeling material within the feed channel towards the nozzle. The system further having a pressure determining means for determining a first parameter indicative for a pressure exerted on the modeling material. The system further having a control system arranged for controlling the modeling material feeding means based on the determined first parameter indicative for a pressure exerted on the modeling material. A method of three-dimensional modeling using the system.

30 Claims, 11 Drawing Sheets

(51) Int. Cl.
     *B33Y 30/00*               (2015.01)
     *B29C 64/209*           (2017.01)
     *B29C 64/393*           (2017.01)
     *G06F 30/00*             (2020.01)
     *B33Y 50/02*             (2015.01)
     *B33Y 70/00*             (2020.01)
     *B33Y 80/00*             (2015.01)
     *B29K 101/12*           (2006.01)

(52) U.S. Cl.
     CPC ............... *B33Y 10/00* (2014.12); *B33Y 30/00* (2014.12); *B33Y 50/02* (2014.12); *B33Y 70/00* (2014.12); *B29K 2101/12* (2013.01); *B33Y 80/00* (2014.12); *G06F 30/00* (2020.01)

(56) References Cited

U.S. PATENT DOCUMENTS

| | | | |
|---|---|---|---|
| 2016/0039150 A1* | 2/2016 | Kemperle | B33Y 30/00 425/135 |
| 2017/0050388 A1* | 2/2017 | Minardi | B29C 64/386 |
| 2017/0136707 A1* | 5/2017 | Batchelder | B33Y 30/00 |
| 2017/0157844 A1* | 6/2017 | Mandel | B29C 64/393 |
| 2017/0165920 A1* | 6/2017 | Leavitt | B29C 64/118 |
| 2018/0111313 A1* | 4/2018 | Murao | B29C 64/118 |

\* cited by examiner

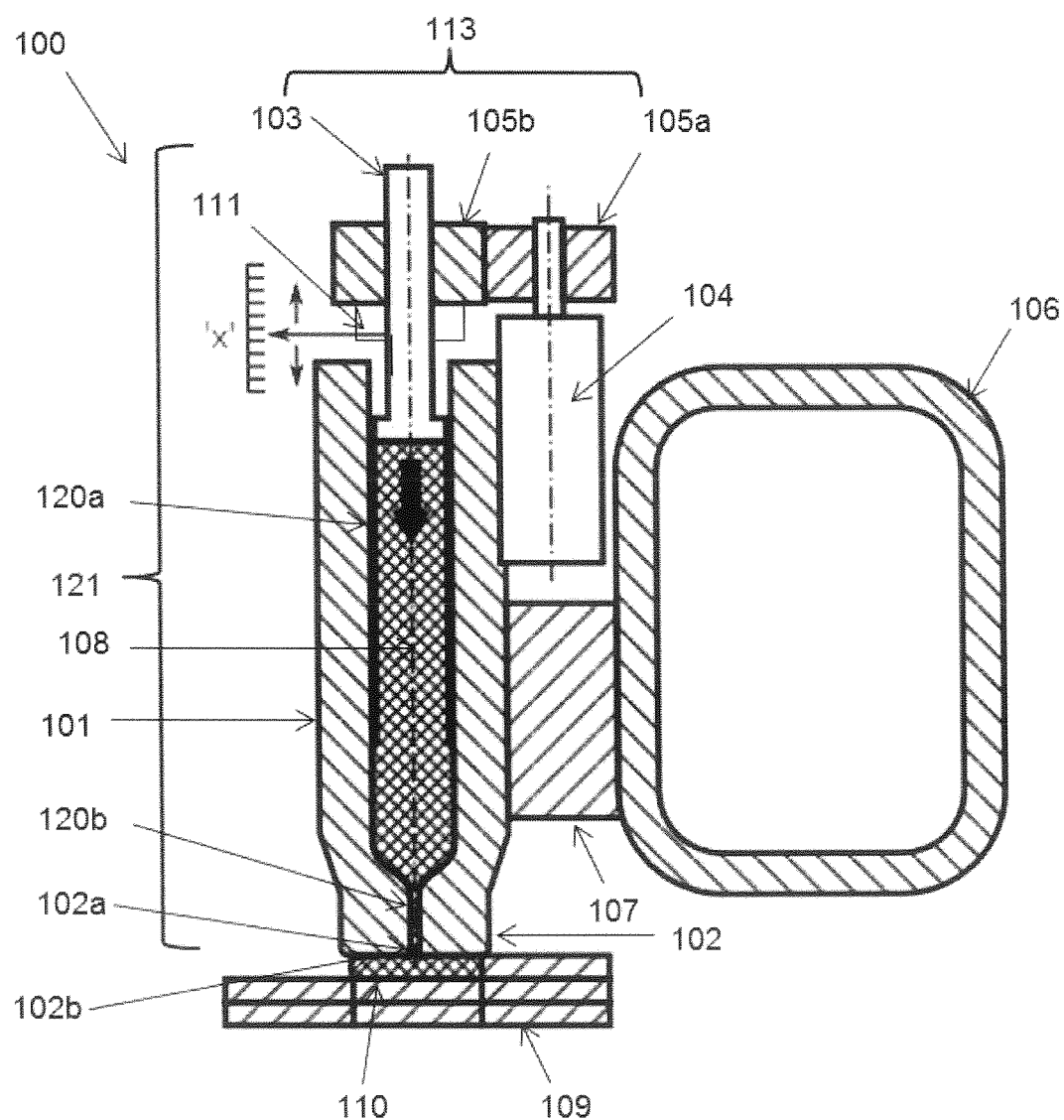
Fig. 1a (State of the art)

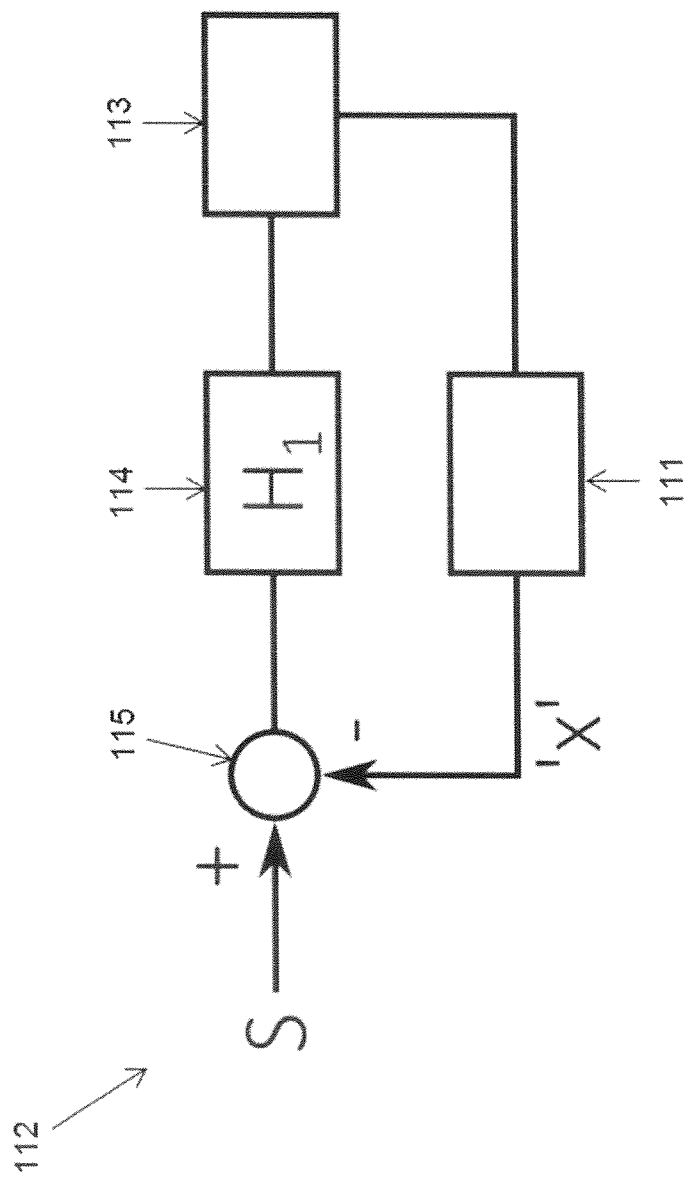
Fig. 1b (State of the art)

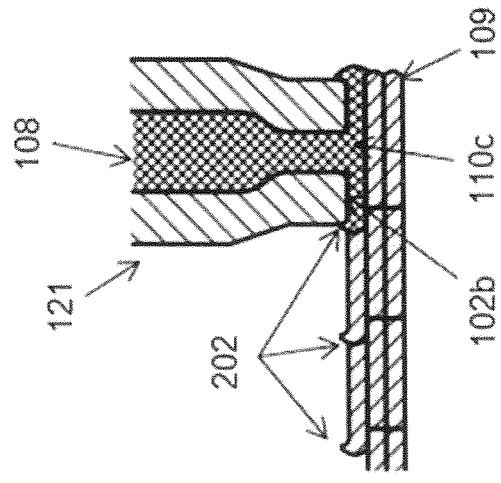
Fig. 2a (State of the art)
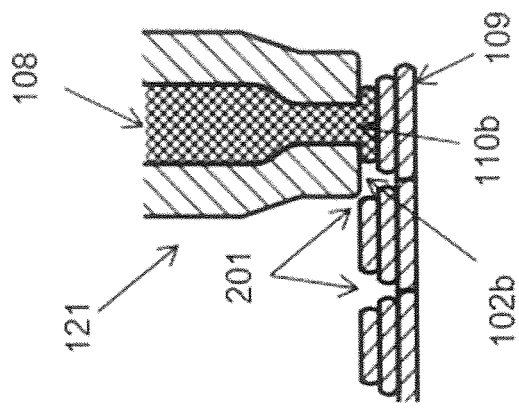
Fig. 2b (State of the art)
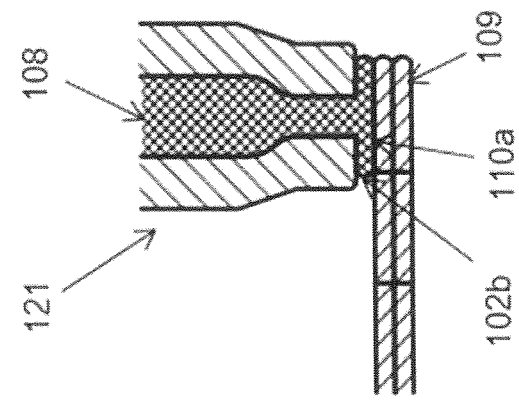
Fig. 2c (State of the art)

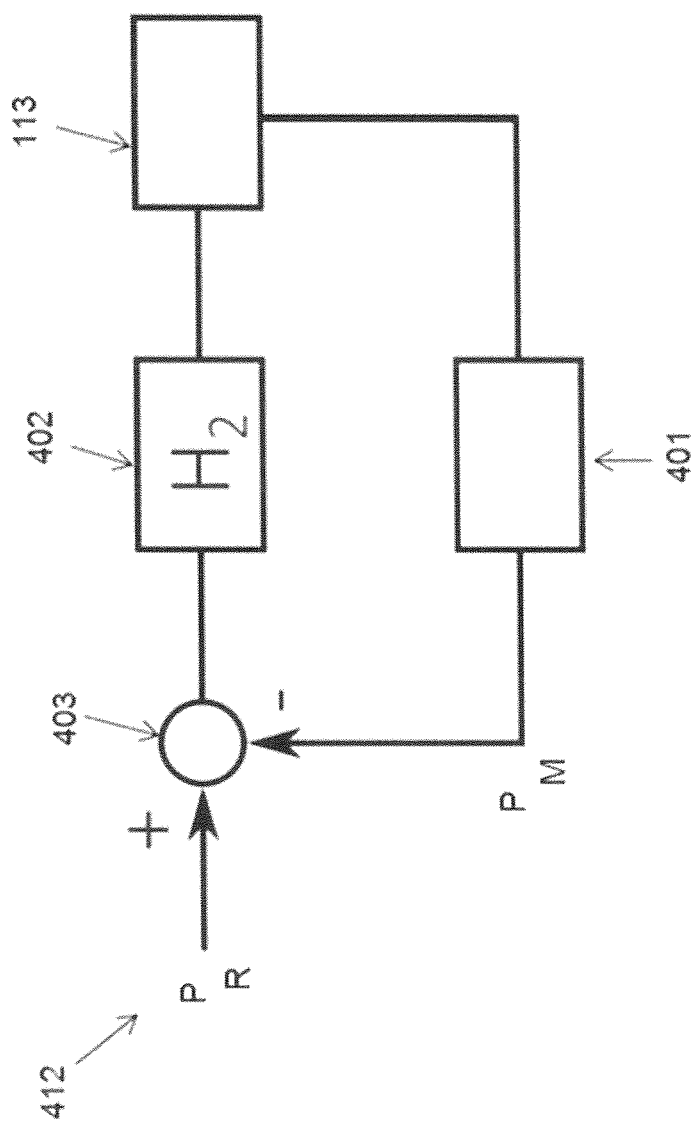

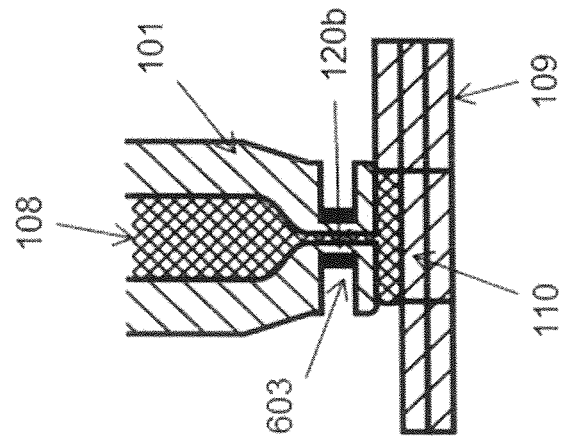
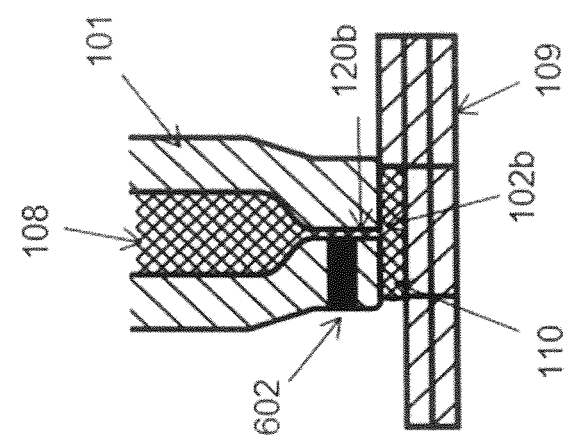
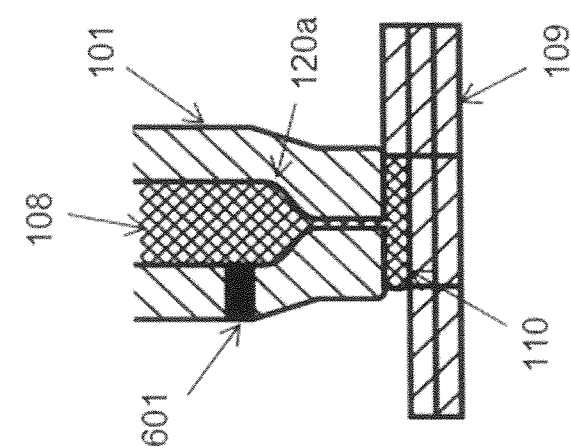

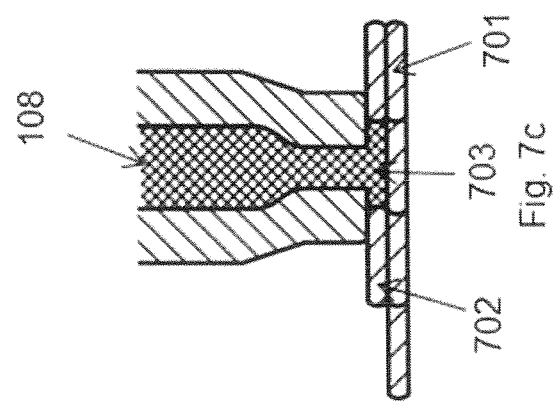
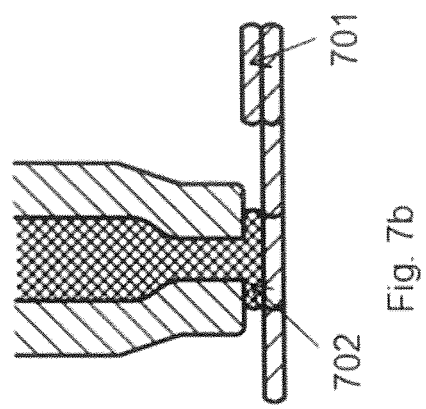
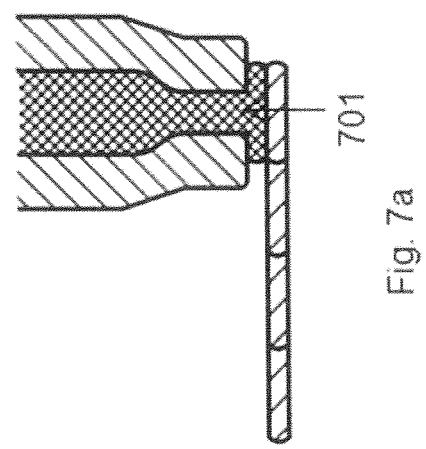

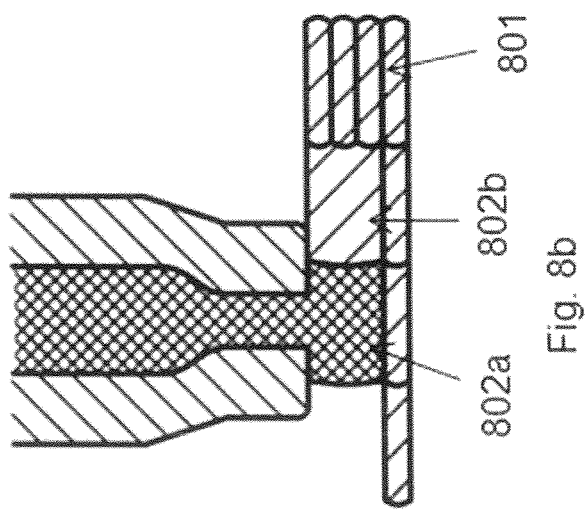
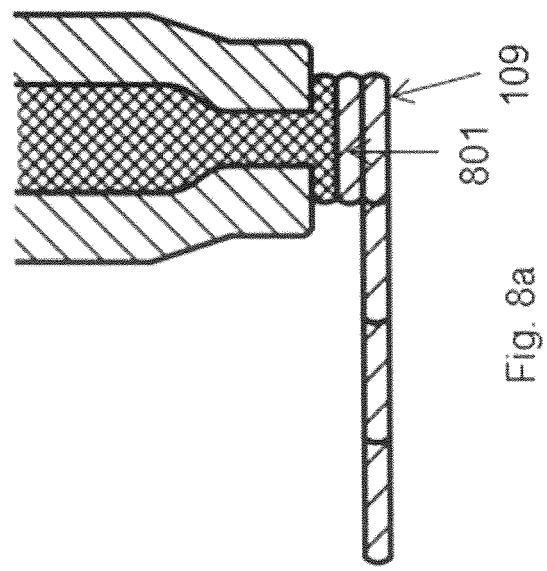

THREE-DIMENSIONAL MODELING SYSTEM AND METHOD

FIELD OF THE INVENTION

The invention relates to a three-dimensional modeling system for creating a three-dimensional object, and a method of three-dimensional modeling a three-dimensional object.

BACKGROUND OF THE INVENTION

In three-dimensional modeling objects are formed by layering modeling material in a controlled manner such that a desired three-dimensional shaped object can be created. This way of forming objects can also be referred to as additive manufacturing. Very often for three-dimensional modeling a three-dimensional modeling printer is used. The printer has a three dimensionally moveable printhead which dispenses the modeling material, while the printhead is moved over previously deposited tracks of the modeling material.

The object to be printed can be placed on a base. The printhead is movable in a three-dimensional space relative to the object being modeled or printed or vice versa. In some cases, the object is movable in one or more dimensions relative to the printhead. Various combinations are possible for moving the object on which the object is modeled relative to the printhead and vice versa.

The motions of the printhead are controlled by a control system which controls in a 3-dimensionally controllable positioning system to which the printhead is attached. By means of software a pattern of tracks can be designed, which pattern is used for moving the printhead and for depositing the tracks.

The object is created on a base structure in a reference location relative to the movable printhead. The modeling material can be fused with previously formed tracks. The three-dimensional modeling material can be fed in the printhead in the form of for example filaments, granulate, rods, liquid or a suspension. The printhead dispenses the modeling material from the printhead through a nozzle and deposits it on the base in the form of tracks forming a layer of tracks, or when a previous layer of the object to be created has been deposited, on the object on previously deposited tracks where it is allowed to solidify. The modeling material can be thermally or chemically or otherwise fused with the previously deposited tracks. The chemically modeling material can be dispensed from the printhead and deposited on the previously deposited tracks and cured to solidify immediately after the deposition.

The relative motion of the base and object to the printhead in tracks and simultaneous deposition of modeling material from the printhead allow the fused deposition modeled object to grow with each deposited track and gradually attains its desired shape.

In current material extrusion printers (including granulate extruders, ram extruders and syringe extruders), the material is deposited in a feed forward, flow-controlled way. The flow of the modeling material is kept constant, depending on thickness of the tracks to be deposited and the print speed. As part of the machine calibration, the material flow is calibrated.

Moreover, the X-Y-Z positioning system which causes the printhead to move over the previously deposited tracks of the object being created must be calibrated in order to maintain accurate dimensions of the object to be created and specially to maintain a controlled thickness of the tracks being deposited.

When the calibration is correct, solid objects can be printed accurately using flow control. When the gap between the printhead nozzle and the previously deposited layer for example increases due to lack of calibration, the flow of modeling material can become too small to fill up the gap, thereby causing the occurrence of spaces between the printed tracks, resulting in cavities in the printed object. This is called under-extrusion.

On the other hand, when the gap between the printhead nozzle and the previously deposited tracks decreases due to lack of calibration, the flow of modeling material can become too high for the track being deposited, so too much material will be extruded. This is called over-extrusion. Over-extrusion can also occur when the track is laid between two previously deposited tracks and the space therebetween is narrowing This may result in excessive forces between the object and the printhead and in a rough surface of the object due to overflow of the modeling material. The overflow of modeling material may lead to debris or residue on the nozzle tip of the printhead which may come off the nozzle tip and fuse with the object being printed and cause potential loss of the object.

Loss of calibration may also be caused by thermal expansion and while printing and subsequent shrinking after printing of thermally fused material. When the thermal expansion and shrinking is insufficiently compensated, the gap between nozzle and previously deposited tracks may not have constant dimensions. Likewise, also dimensions in directions perpendicular to the deposition direction by the printhead or nozzle may vary due to thermal effects.

Another cause of under- or over extrusion may lie in variation of the modeling material feedstock dimensions. When for example filament of modeling material is used, its diameter may vary causing variations in the amount of modeling material deposited when printing, giving cause to under- or over-extrusion when using constant flow control of the modeling material being deposited.

When performing the calibration of the X-Y-Z system and of the feeding means of the modeling material, the highest priority is to prevent over-extrusion, since this will make the process unreliable. Therefore, three dimensional modeling extrusion printers usually have some degree of under-extrusion causing formation of open spaces or cavities. As a side effect, parts will not be leak-tight or pressure resistant and the strength of the part will be sub-optimal.

SUMMARY OF THE INVENTION

It is therefore an object of the invention to overcome the above described problems and disadvantages.

The object is achieved in a three-dimensional modeling system for creating an three-dimensional object comprising a three-dimensional modeling printhead, wherein the printhead is attached to positioning means spatially moving at least one of the printhead and the object being printed relative to one another.

The printhead comprises a tubular feed member and a nozzle arranged at one end of the tubular feed member, the nozzle having an outlet for dispensing modeling material, and a nozzle tip, for facing previously deposited tracks of modeling material on the object to be created.

The tubular feed member comprises a feed channel for feeding the modeling material to the nozzle outlet.

The system further comprises modeling material feeding means arranged at an end of the tubular feed member opposite of the nozzle, wherein the modeling material feeding means are arranged for exerting a pressure exerted on the modeling material within the feed channel towards the nozzle.

The system further comprises pressure determining means for determining a first parameter indicative for a pressure exerted on the modeling material.

The system further comprises a control system arranged for controlling the modeling material feeding means based on said determined first parameter indicative for a pressure exerted on the modeling material.

The control system is arranged for controlling the positioning means and the printhead for depositing two first tracks, wherein said two first tracks are spaced apart, and for depositing an intermediate track between said two first tracks while controlling the pressure exerted on the modeling material using said first parameter indicative for a pressure exerted on the modeling material.

By controlling the pressure, it can be sensed by the control system using the pressure determining means that the under-extrusion occurs when for example the pressure drops below a certain level. By increasing the pressure exerted on the modeling material within the tubular feed member, this under-extrusion can be compensated for. This may occur for example when a space between previously deposited adjacent tracks is widening while depositing the current track.

On the other hand, it can be sensed that over-extrusion occurs when said first parameter indicative of the pressure exerted on the modeling material pressure increases above a certain level. By decreasing the pressure exerted on the modeling material within the tubular feed member, this over-extrusion can be compensated for. This may occur for example when a space between previously deposited adjacent tracks is narrowing. By controlling the pressure of the modeling material, remaining spaces in the printed object will be filled well, independent of the volume of the remaining space. This will result in fusing of the intermediate track being deposited with the previously deposited adjacent tracks, causing total infill of cavities and improved bonding between adjacent tracks. Therefore, parts will have optimal leak tightness and strength.

The track thickness, determined by the gap between nozzle and previously deposited layer, is usually very small. This implies that the pressure drop over this gap is large due to viscosity of the modeling material. It requires only a distance in the order of magnitude of a millimeter for the pressure drop from the level of the pressure in or at the nozzle tip to reach ambient pressure. As the distance to the nozzle becomes larger, the pressure drop over the gap increases. When the pressure drop is equal to the overpressure in the nozzle, the flow stops, and the track does not become wider. As the printhead moves over the object, this balances out to become a stable track width.

The main difference with flow-controlled printing is that width of the intermediate track being deposited balances out to a constant line width while filling up all the gaps nicely, while flow-based printing would soon result in systematic under- or over-extrusion.

By controlling the pressure exerted on the modeling material, variations in the gap size between the nozzle and previously deposited tracks are compensated for.

In an embodiment of the system according to the invention, the control system is arranged for controlling the modeling material feeding means to maintain said first parameter indicative for a pressure exerted on the modeling material between a predetermined minimum pressure value and a predetermined maximum pressure value. This allows the pressure exerted on the modeling material to be within a range ensuring that no over- or under-extrusion occurs, regardless of imperfections of alignment or calibration of the positioning means.

In an embodiment of the system according to the invention, the control system is arranged for maintaining said first parameter indicative for a pressure exerted on the modeling material at a constant value. This further improves intermediate tracks to be deposited between or adjacent previously deposited tracks to be filled up fully without leaving open spaces, or cavities, while preventing formation of debris and residue. Moreover, the constant pressure reduces wear in the printhead and modeling material feeding means.

In an embodiment of the system according to the invention, the modeling material feeding means comprise a controllable drive and transmission means connected to the drive for transferring a force generated by the drive to the modeling material. The controllable drive allows the control system to generate a controllable force which results in a pressure exerted on the modeling material within the tubular feed means, i.e. the feed channel and a pressure exerted on the modeling material at the nozzle tip.

In an embodiment of the system according to the invention, the pressure determining means for determining said first parameter indicative for a pressure exerted on the modeling material comprise pressure determining means for determining a second parameter indicative of the pressure exerted on the modeling material within the feed channel. This allows for example said first parameter indicative for a pressure exerted on the modeling material to be determined by the force exerted on the modeling material by the controllable drive and the transmission means. The thus determined second parameter constitutes a measure indicative for the pressure exerted on the modeling material within the feed channel.

Depending on the modeling material, an appropriate drive and force transmission means can be chosen. The controllable drive is controllable by the control system. Forces at the nozzle tip and torque within the drive and transmission system can be considered indicative for a pressure exerted on the modeling material.

In an embodiment of the system according to the invention, the controllable drive comprises a rotary drive, and the pressure determining means for determining said second parameter indicative of the pressure exerted on the modeling material on the modeling material within the feed channel comprise torque determining means for determining a torque exerted by the rotary drive and/or transmission. This allows said second parameter indicative of the pressure exerted on the modeling material to be derived from the torque exerted by at least one of the rotary drive and the transmission.

In an embodiment of the system according to the invention, the controllable drive comprises an electric motor, and wherein the torque determination means comprise a motor current measuring means. This allows torque determination without any further torque sensor.

In an embodiment of the system according to the invention, the modeling material feeding means comprises a plunger for feeding modeling material into the modeling material feeder. The plunger allows modeling material in the form of rods to be fed into the tubular feed member.

Said second parameter indicative for a pressure exerted on the modeling material within the feed channel is determined by the pressure exerted on the modeling material by the plunger, and wherein the pressure determining means for determining said second parameter indicative of the pressure exerted on the modeling material within the feed channel comprise a force sensor, arranged at the plunger for measuring the pressure exerted by the plunger on the modeling material.

From the exerted force, said second parameter indicative for the pressure exerted on the modeling material within the feed channel can be derived. This is an alternative way to measuring motor current or torque from the drive system to easily determine said second parameter indicative for a pressure exerted on the modeling material within the feed channel of the tubular feed member.

In an embodiment of the system according to the invention, the pressure determining means for determining said second parameter indicative of the pressure exerted on the modeling material within the feed channel comprise a pressure sensor connected to the feed channel of the tubular feed member. Thus, said second parameter indicative of the pressure exerted on the modeling material within the feed channel can be determined directly by the pressure sensor.

In an embodiment of the system according to the invention, the pressure determining means for determining said second parameter indicative of the pressure exerted on the modeling material within the feed channel comprise a pressure sensor connected to the feed channel at the nozzle. Thus, said second parameter indicative of the pressure exerted on the modeling material within the feed channel can alternatively be directly determined by the pressure sensor within the nozzle.

In an embodiment of the system according to the invention, the pressure sensor arranged at the nozzle comprises a nozzle deformation sensor. This has an advantage that the sensor does not need direct contact with the flow of modeling material within the feed channel of the nozzle.

In an embodiment of the system according to the invention, the pressure determining means for determining said first parameter indicative of a pressure exerted on the modeling material comprise pressure determining means for determining a third parameter indicative of a pressure exerted on the modeling material within the intermediate track being deposited. This allows direct measurement and control of the modeling material within the intermediate track being deposited, thus ensuring smooth deposition of the modeling material and optimal fusing with laterally previously deposited tracks.

In an embodiment of the system according to the invention, the pressure determining means for determining said third parameter indicative of a pressure exerted on the modeling material within the intermediate track being deposited comprise a pressure sensor having a fluid channel at the nozzle tip for measuring a pressure in the deposited modeling material at the nozzle tip. The fluid channel at the nozzle tip allows measuring a pressure in the deposited intermediate track outside the nozzle near the nozzle outlet. This allows direct measurement of the pressure at the nozzle tip, within the modeling material being deposited, ensuring fast and accurate pressure measurement.

In an embodiment of the system according to the invention, the pressure determining means for determining said third parameter indicative of a pressure exerted on the modeling material within the intermediate track being deposited comprise a force sensor arranged between the printhead and the positioning means. The force exerted by the printhead, i.e. nozzle tip, on the modeling material of the intermediate track being deposited, can be measured by measuring a counterforce at a different location in the mechanical path from the printhead via the gantry and positioning system, base, to the object to be created, which transmits the force exerted by the printhead on the intermediate track being deposited. From the determined force, the pressure exerted on the modeling material at the tip can be derived.

In an embodiment of the system according to the invention, the force sensor is arranged at an interconnection of the printhead and the positioning means. In this case the force can be measured between the printhead and positioning means, more specifically the gantry against which the printhead is mounted.

In an embodiment of the system according to the invention, the pressure determining means for determining said third parameter indicative of a pressure exerted on the modeling material within the intermediate track being deposited comprises a force sensor arranged on a base of the positioning means, which is arranged for receiving the object to be created. The object to be created is located at the reference location. It can be mounted on the base. A force on the build plate can be measured, or alternatively a force between the build plate and positioning means can be measured from which the parameter indicative of the pressure can be derived.

The determined pressure can be compensated by the weight of the object being printed. This weight can for example be determined by the force sensor when the printhead is not active or withdrawn. This can be performed in time intervals during the printing process wherein the deposition of tracks is performed.

In an embodiment of the system according to the invention, the system further comprises modeling material flow determining means. This allows determination of an amount of modeling material used in depositing tracks. From the modeling material flow and printing speed a thickness of the deposited tracks can be determined.

In an embodiment of the system according to the invention, the flow determining means comprise a displacement sensor for determining displacement of the modeling material feeding means, and wherein the control system is arranged for determining the flow by determining a displacement per unit in time. The modeling material feeding means push the modeling material into the tubular feed member. By measuring a displacement of the feeding means per time unit, a modeling material flow can be determined from the displacement in time and a cross section area of the tubular feeding member.

In an embodiment of the system according to the invention, the flow determining means comprise a flow sensor for determining flow of the modeling material.

In an embodiment of the system according to the invention, the flow determining means comprise a sensor for determining a rotation speed of the rotary drive. The rotary drive drives the modeling material feeding means. Displacement of the modeling material within the tubular feed member is thereby linked to the rotary speed of the rotary drive. Thus, from the rotary speed of the rotary drive the modeling material flow in the tubular feeding member can be derived. This has an advantage in that when an electric motor is utilized as rotary drive, the rotary speed can easily be determined from electric parameters associated with the driving of the motor. Thus, no separate displacement sensor is required.

In an embodiment of the system according to the invention, the control system is further arranged for alternatively controlling a flow of the modeling material using the determined modeling material flow.

In an embodiment of the system according to the invention, the control system is further arranged for controlling the positioning means and the printhead for depositing said two first tracks while controlling said flow of the modeling material. In this scheme, the first two tracks may be deposited independent of previously deposited tracks. Such tracks do not require a high filling grade for preventing spaces and cavities, thus flow control can be used. The intermediate track to be deposited between the first two tracks however requires the high filling grade leaving no cavities. Thus, this intermediate track can be deposited using pressure control.

The tubular feed member can be heatable by a heating element arranged around at least a lower portion of the tubular feed member adjacent to the nozzle. This allows heatable modeling material to be processed by the fused deposition modelling system. The modeling material is heated while it is pushed into the tubular feed member. When the modeling material reaches the nozzle is heated to the modeling material melting temperature. The heating element can be dimensioned and controlled to reach the required melting temperature.

The nozzle can be heatable by a heating element arranged around or within the nozzle. This allows the heating element of the tubular feed member to be adjusted to a lower temperature preventing the modeling material to thermally degrade as some materials can only be kept at a high temperature, i.e., melt temperature for a limited time. Only in the last part of the feed channel near the nozzle the modeling material is heated to its melting temperature, thus adequate printing is provided while the modeling material is maintained in good condition, i.e. degradation is prevented.

The object is further achieved in a method of three-dimensional modeling, comprising performing three-dimensional modeling using the system for three-dimensional modeling as described above, wherein the method further comprises feeding the modeling material using the modeling material feeding means, determining a first parameter indicative of a pressure exerted on the modeling material, controlling the modeling material feeding means depending on said first parameter indicative of the pressure exerted on the modeling material, depositing two first tracks of three-dimensional modeling material, wherein said two first tracks are spaced apart, and depositing an intermediate track between said two first tracks while controlling the pressure exerted on the modeling material using said first parameter indicative for a pressure exerted on the modeling material.

In an embodiment of the method according to the invention, the controlling the modeling material feeding means depending on said first parameter indicative of the pressure exerted on the modeling material comprises comparing said first parameter indicative of the pressure exerted on the modeling material with a reference value, and wherein the controlling is based on a difference between said first parameter and the reference value.

In an embodiment of the method according to the invention, the controlling the modeling material feeding means depending on said first parameter indicative of the pressure exerted on the modeling material comprises maintaining said first parameter indicative of the pressure exerted on the modeling material between a previously determined minimum pressure value and a previously determined maximum pressure value.

In an embodiment of the method according to the invention, the controlling the modeling material feeding means depending on said first parameter indicative of the pressure exerted on the modeling material comprises maintaining said first parameter indicative of the pressure exerted on the modeling material at a previously determined constant value.

In an embodiment of the method according to the invention, the determining said first parameter indicative of a pressure exerted on the modeling material comprises determining a second parameter indicative of a pressure exerted on the modeling material within the feed channel of the tubular feed member and/or nozzle.

In an embodiment of the method according to the invention, the determining said first parameter indicative of a pressure exerted on the modeling material comprises determining a third parameter indicative of a pressure exerted on the modeling material within the intermediate track being deposited.

In an embodiment of the method according to the invention, the method further comprises determining a modeling material flow and alternatively controlling a flow of the modeling material using the modeling material flow.

In an embodiment of the method according to the invention, the method further comprises depositing said two first tracks while controlling said flow of the modeling material.

BRIEF DESCRIPTION OF THE DRAWINGS

FIG. 1a shows a diagram of a system for three-dimensional modeling according to the state of the art.

FIG. 1b shows a block diagram of a control system for controlling a system for three-dimensional modeling according to the state of the art.

FIGS. 2a-2c show aspects of a system for three-dimensional modeling according to the state of the art.

FIG. 4b shows a block diagram of a control system for controlling a system for three-dimensional modeling according to an embodiment of the invention.

FIGS. 6a-6d show aspects of a system for three-dimensional modeling according to an embodiment of the invention.

FIGS. 7a-7c show aspects of a system for three-dimensional modeling according to an embodiment of the invention.

FIGS. 8a-8b show aspects of a system for three-dimensional modeling according to an embodiment of the invention.

DETAILED DESCRIPTION OF EMBODIMENTS

Figure 3A:
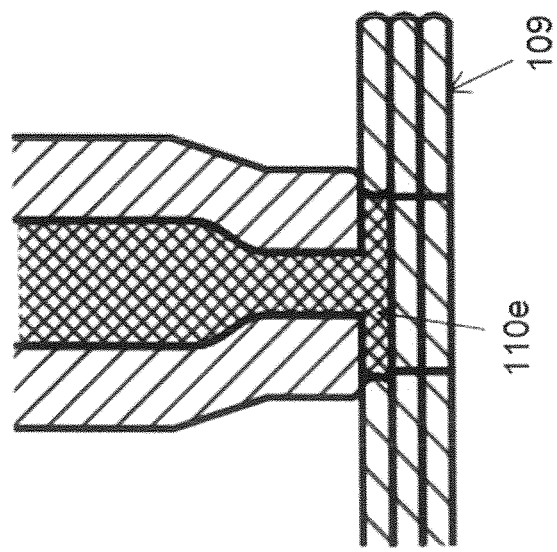
FIGS. 3a-3b show aspects of a system for three-dimensional modeling according to an embodiment of the invention.

In FIG. 1a a system for three-dimensional modeling 100 is shown in a simplified form. The system 100 comprises a three-dimensional modeling printhead 121 attached via a connection 107 to a gantry 106, which gantry 106 is comprised in a X-Y-Z positioning system, not shown in FIG. 1a, which allows the printhead 121 and object to be printed to be moved relatively to one another while depositing tracks 110 of modeling material. The tracks 110 can be deposited in layers. The printhead 121 comprises a tubular feed member 101, which acts as an extruder tube, and which is arranged for feeding modeling material 108 from one end of the tubular feed member 101 towards a nozzle 102 connected at the opposite end of the tubular feed member 101. The tubular feed member 101 can for example be made from a metal, such as stainless steel.

The tubular feed member 101 and the nozzle 102 comprise a feed channel having sections 120a, 120b respectively. The feed channel section 120a allows the modeling material 108 to be introduced and pushed towards the nozzle, whereas the feed channel section 120b is positioned within the nozzle 102, and which leads to the nozzle outlet 102a at the nozzle tip 102b. During printing, the nozzle tip 102b is in contact with the modeling material of a track 110 being deposited.

The three-dimensional modeling material 108 may include thermoplastic polymers such as for example polylactic acid (PLA), acrylonitrile butadiene styrene (ABS), polycarbonate (PC) and polyether ether ketone (PEEK). These materials can be melted within the tubular feed member 101 and dispensed from the nozzle 102 in tracks 109, 110, for forming an object to be created.

The tubular feed member 101, and also the nozzle 102 can be provided with one or more heating elements, which can be arranged around the tubular feed member 101 to heat and melt modeling material feedstock in order to allow the printhead 121 to deposit and fuse modeling material in a molten state.

Other materials for three-dimensional modeling may include pastes, suspensions or resins, which can be deposited in thin tracks 109, 110 and cured for example by exposure to ultraviolet light, air, heat, or other curing agents.

The modeling material 108 is deposited on a base in a first track, and on previously deposited tracks 109 in successive deposition operations conducted by the X-Y-Z positioning system. The base can be a base plate, ground or any other structure suitable for initiating the deposition of tracks and building and carrying the object to be printed. The base can be fixed or movable. In some cases, the base is movable in a horizontal X-Y direction, whereas the printhead 121 is movable in a vertical Z-direction. In other cases, the base is movable in X-Y-Z horizontal and vertical direction relative to the printhead 121. In again other cases, the printhead is movable in X-Y-Z horizontal and vertical direction relative to the base. In this description the latter case is provided by way of example.

While the printhead 121 is moved over the previously deposited tracks 109, a drive system 113 comprising a rotary drive 104, a transmission gear 105a,105b for transmitting the rotary motion of the rotary drive 104 to a longitudinal motion of a plunger 103, which pushes the modeling material within the feed channel section 120a of the tubular feed member 101 towards the nozzle 102. The rotation movement of the drive 104 can be converted into translation of the plunger 103 via transmission gear 105a, 105b, and a spindle transmission to the plunger 103.

The pressure exerted on the modeling material 108 by the rotation to translation transmission can be derived from the determined torque using the transfer ratio of the angular displacement of the motor axle and the longitudinal displacement of the plunger 103 attached to a spindle of the rotation to transmission gear 105a, 105b. The rotary drive 104 can be a stepper motor which can be controlled digitally to proceed a discreet number of steps in a chosen direction. The rotary drive 104 can also be an electric motor, DC or AC, or servomotor, which is controllable by voltage and/or current supplied to the motor. In the latter case, an encoder connected to the motor axle may provide position information of the motor.

The skilled person will understand that control of pressures exerted on modeling material in printheads utilizing non-rotary drives and transmission gear used in a fused deposition modeling system will be similar to rotary type drives and transmission.

The plunger 103 can be provided with a displacement sensor 111, which can be arranged to measure a displacement X of the plunger 103 relative to the tubular feed member 101. The state of the art as depicted in FIG. 1a is shown as an example for example feeding modeling material rods in the tubular feed member 101 to the nozzle 102. In the art alternative examples of feeding modeling material to the nozzle 102 are available, such as feeding modeling material filament into a tubular feed member 101 using for example filament punch rollers, which can be driven by an electric motor. The deposition of tracks 110 on top of previously deposited tracks 109 performed in similar ways using a X-Y-Z positioning system whilst the modeling material filament is fed into the tubular feed member 101.

The system 100 according to FIG. 1a, can be controlled by a control system which is arranged to dispense three-dimensional modeling material at a rate proportional to a required track thickness and printing speed. To achieve this, a predetermined flow of the modeling material 108 is to be achieved. The control system controls the rotary drive 104, and a displacement sensor 111 measures displacement X of the plunger 103. The displacement of the plunger 103 per time unit provides the flow of the modeling material 108, thereby allowing the control system to regulate the required amount of dispensed modeling material 108 in track 110.

In FIG. 1b a block diagram of an example of a flow control system 112 is shown wherein a set value S for the required flow is provided to a subtraction unit 115, which is arranged to subtract the calculated displacement X per time unit from the set value S, thereby giving an error signal which can be supplied to a regulator module 114 of the control system.

The flow regulator module 114 can be provided with an appropriate transfer function H1, having a proportional, proportional and integrating, or proportional integrating and differential control function. The flow control system 112 may control the rotary drive 104 and transmission gear 105a, 105b and the transmission of the spindle transmission from the gear wheal 105b to the plunger 103 in drive system 113, symbolically depicted as a block in FIG. 1b.

As described the displacement of the plunger 103 can be obtained from the displacement sensor 111, however the skilled person may find alternatives for establishing the displacement of the plunger 103.

In FIG. 2a three-dimensional modeling by deposition of modeling material is illustrated according to the state of the art. A new track 110a of modeling material is deposited on previously deposited tracks 109. In an ideal situation, the deposited tracks are continuously deposited. There are no gaps between the previously deposited tracks and tracks, neither in horizontal direction nor in vertical direction. This can be achieved when the flow of modeling material is accurately controlled relative to the required track thickness and deposition speed of the printhead 121. The degree and tightness of depositing modeling material depends highly on calibration of the system or printer.

In FIG. 2b, a common fault in flow controlled three-dimensional modeling is shown called under-extrusion. In under-extrusion, cavities or gaps 201 occur during the deposition of the modeling material. A track 110b is shown which is incompletely dispensed while printing on the printing on the previously deposed tracks. Such gaps 201 may occur when the three-dimensional modeling system is not properly calibrated. When performing the calibration, the aim is normally to prevent over-extrusion, since this will make the process unreliable. However, perfect calibration is not possible due to random errors, therefore three-dimensional modeling systems or printers usually have some degree of under extrusion. As a side effect, parts will not be leak-tight or pressure resistant and the strength of the part will be sub-optimal.

In FIG. 2c, over-extrusion is represented. In over-extrusion, the flow of modeling material into the over-extruded track 110c is too high. As a consequence, crests 202 of modeling material may occur, caused by the nozzle tip 102b accumulating modeling material and pushing excess modeling material to the sides, transverse to the deposition or printing direction.

In FIG. 3a, track 110d of modeling material is deposited ideally tight fitting between previously deposited tracks 109 independent of the volume of the remaining space between these tracks. Similarly, in FIG. 3a. the space between the previously deposited tracks 109 is narrower than the tracks themselves.

Figure 3B:
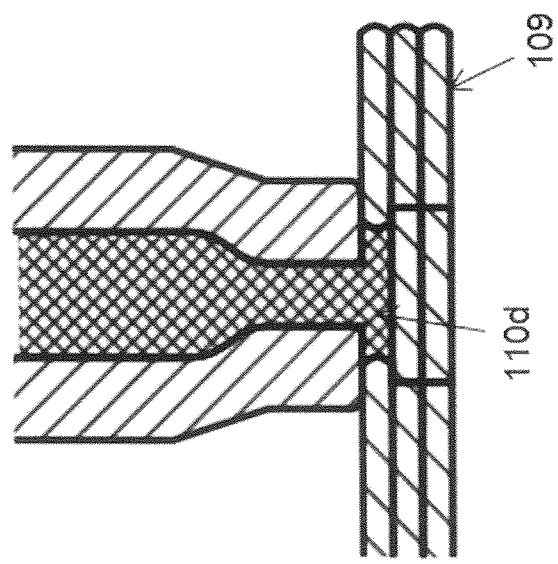

In the example of FIG. 3b, the tight fitting deposited track 110e is broader than the previously deposited tracks. This will result in total infill of cavities and improved bonding to adjacent and lower print tracks. Therefore, parts printed in this way will have optimal leak tightness and strength, which can be achieved in a deposition modeling system as described below.

Figure 4A:
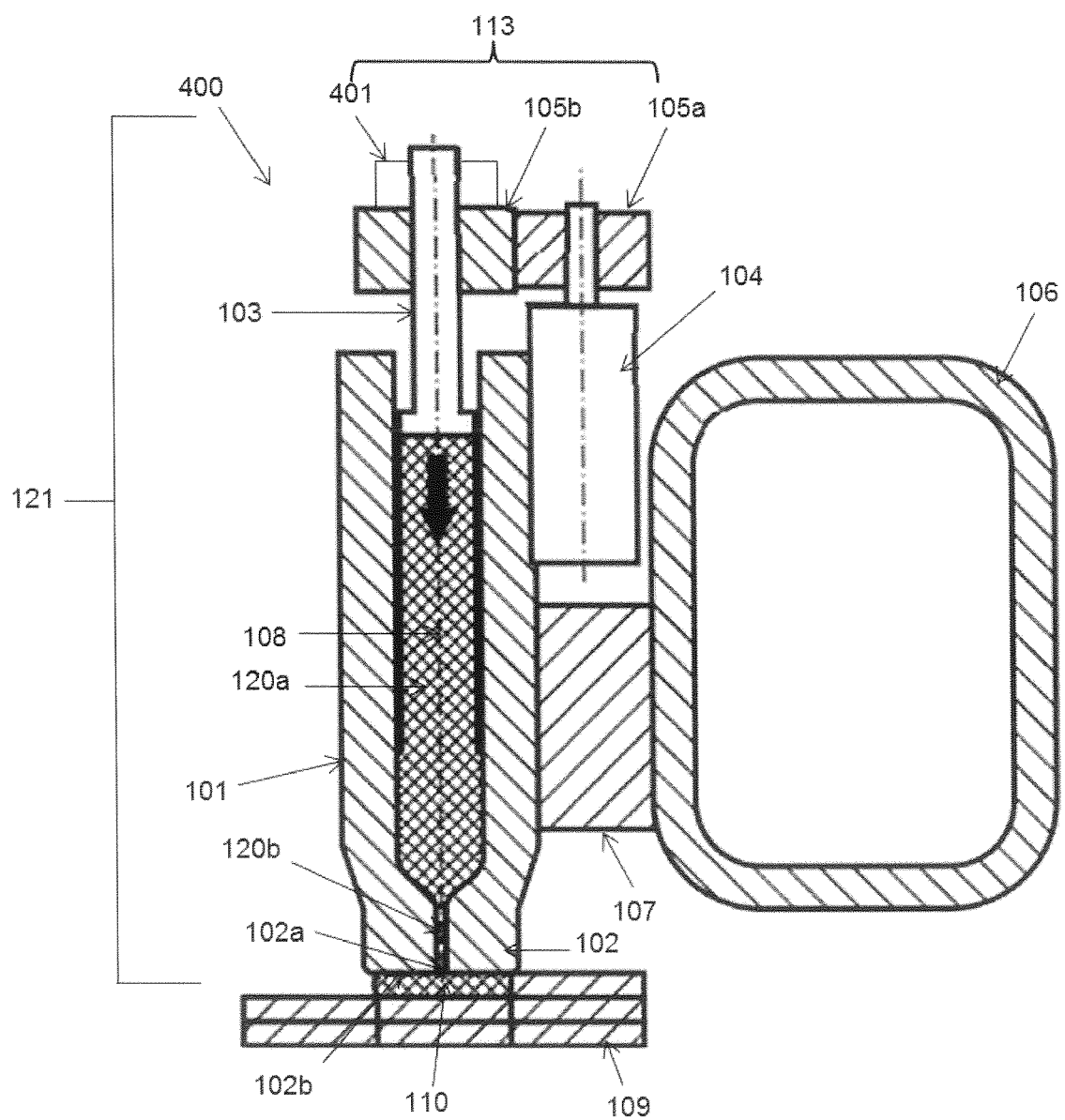
FIG. 4a shows a diagram of a system for three-dimensional modeling according to an embodiment of the invention.

In FIG. 4a a three-dimensional modeling system 400 for fused deposited modeling is shown similar to FIG. 1a. A torque sensor 401 can be provided to measure the torque exerted by the rotary drive 104 and transmission gear 105a, 105b to the plunger 103 and thereby to the modeling material 108. From the measured torque, a pressure exerted on the modeling material 108 in the tubular feed member 101 can be derived.

Alternatively, a pressure sensor may be attached to the plunger 103. The pressure sensor is arranged for measuring the pressure exerted by the plunger 103 to the modeling material 108. The plunger pressure sensor can be attached to the tip of the plunger 103 to measure the pressure exerted on the modeling material 108 directly. The plunger pressure sensor can also be a force sensor attached to the point of engagement of the plunger 103 with the rotary drive 104 and/or transmission system 105a, 105b. Moreover, the pressure sensor can be a strain gauge attached the plunger stem. When a pressure or force is applied to the plunger 103, this pressure or force is transferred to the modeling material 108. Due to the applied pressure or force, the plunger stem may deform, which deformation can be measured by the strain gauge. The pressure exerted by the plunger 103 on the modeling material 108 in a higher end of the tubular feed member 101 eventually results in a pressure of the modeling material 108 within the nozzle 102.

In FIG. 4b, a block diagram of an example of a control system 412 is shown for performing pressure controlled three-dimensional modeling with the system 400. As an example, the torque sensor 401 can provide a measured torque of the motor which drives the modeling material feed means which can be used as the measured parameter $P_M$ indicative of the pressure exerted on the modeling material 108, wherein the measured torque is a representative parameter of the pressure within the feed channel 120a, 120b of the tubular feed member 101. Alternatively, the motor current can be used as parameter $P_M$ indicative of the pressure exerted on the modeling material 108, wherein the motor current is a representative parameter of the pressure within the feed channel 120a, 120b. The motor current is proportional to the torque delivered by the motor to the transmission gear 105a, 105b to the plunger 103. Moreover, the plunger pressure can be used as a first parameter $P_M$ indicative of the pressure exerted on the modeling material 108.

The control system 412 can be arranged to compare the measured first parameter $P_M$ to a reference parameter value $P_R$, by means of a subtractor 403. The measured first parameter $P_M$ is subtracted in the subtractor 403 from the reference parameter value $P_R$, to produce an error signal or difference which is supplied to the pressure regulation module 402 having a transfer function $H_2$. The transfer function H2 can be proportional (P), proportional and integrating (PI), or proportional, integrating and differentiating (PID). The pressure regulation module 402 controls the drive system 113.

By controlling the rotary drive 104, a torque is exerted on the plunger 103 via transmission gear 105a, 105b, which torque representing the pressure exerted on the modeling feedstock in the feed channel 120a, 120b can be measured using torque sensor 401. Thus, pressure control on the modeling material 108 within the tubular feed member 101 can be achieved.

The reference value or setpoint $P_R$ may vary depending on printhead travel speed, gap size, temperature, modeling material properties.

Figure 5:
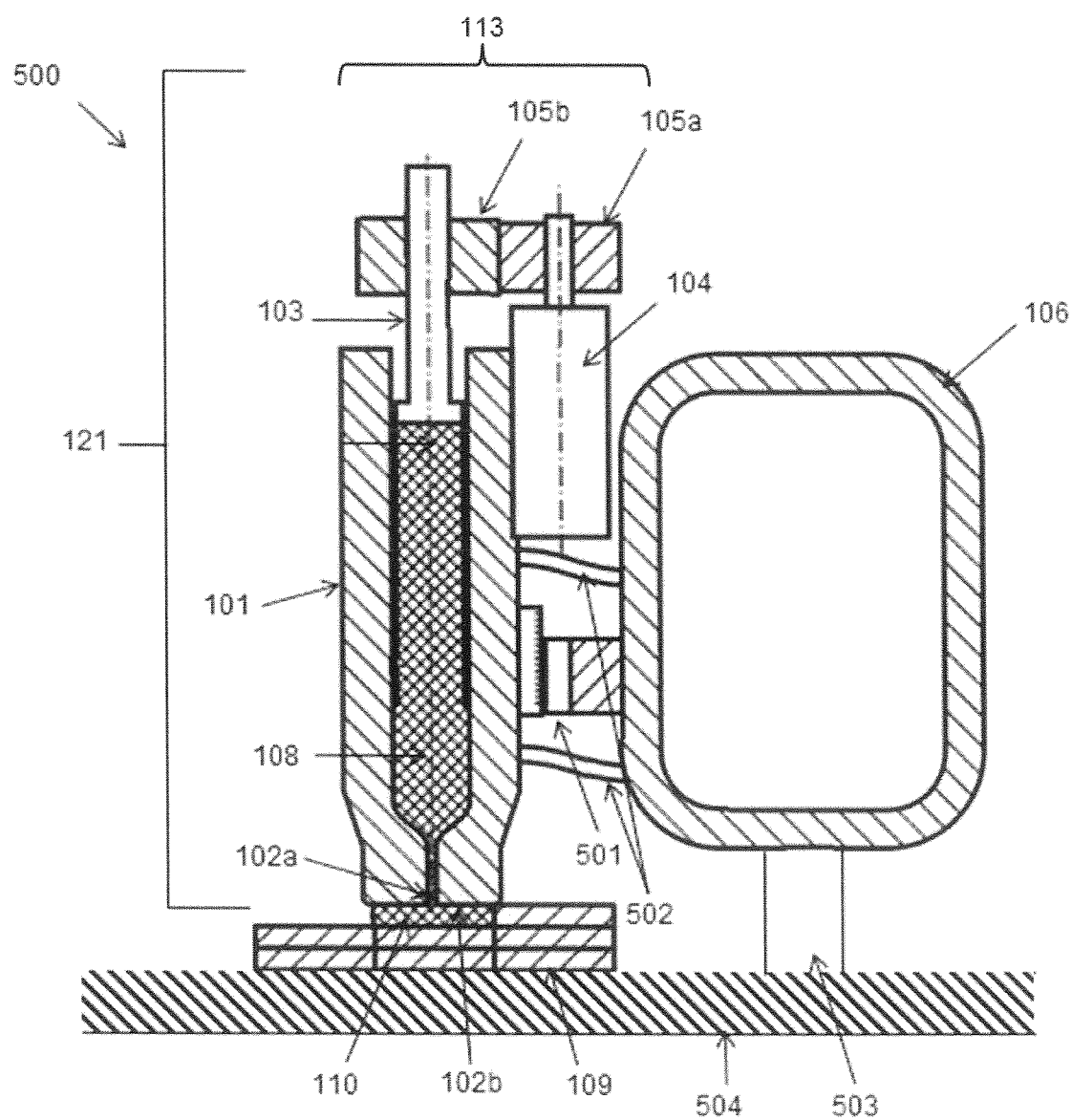
FIG. 5 shows a diagram of a system for three-dimensional modeling according to an embodiment of the invention.

In FIG. 5 a three-dimensional modeling system 500 for pressure control at the nozzle tip is shown corresponding to the system of FIG. 4a having an alternative way for establishing the first parameter $P_M$ indicative of the pressure exerted on the modeling material 108. In the system of FIG. 4a, the parameter is indicative of the pressure exerted on the modeling material 108 within the printhead 121, i.e. the tubular feed member 101. In the system of FIG. 5, the parameter indicative of the pressure exerted on the modeling material is determined by the pressure exerted on the modeling material being deposited in track 110 at the tip 102b of the nozzle 102. While extruding, by exerting a pressure on the modeling material 108 within the printhead 121, a pressure at the nozzle tip 102b is caused within the deposited layer 110, which results in a force which pushes the nozzle tip 102b away from the previously deposited tracks 109, which force is a representative parameter of the exerted pressure on the modeling material. This force is propagated from the printhead 121 via the gantry 106 and X-Y-Z positioning system 503 which is connected to the base 504 whereupon the object to be modeled is placed.

Alternatively, the X-Y-Z-system and gantry 106 may be connected to ground. Thus, the object to be printed can be on ground which serves as a base for the object to be printed. The force exerted on the modeling material is then measurable between the object and the ground.

The force is thus also being propagated between the gantry 106 and the printhead 121 and can for example be measured at the interconnection 107. The interconnection 107 of the printhead 121 to the gantry 106 of FIG. 4a can be formed by at least one resilient connection member 502. A displacement sensor 501 can measure the deformation of the resilient connection member 502 as a measure for the force transmitted through the propagation path from the printhead 121 to the object to be created via the X-Y-Z system and base, and thereby the pressure exerted on the feed in the deposited track 110. Alternatively, measurement of the force can also be achieved in a system according to FIG. 4a, wherein the interconnection 107 between the printhead 121 and gantry 106 is provided with a load cell or strain gauge, which measure a pressure exerted by the printhead 121 and the track 110 being deposited.

Moreover, the force exerted on the modeling material in the layer 110 being deposited can be measured between the object and the base 504, by for example using a weight scale, or pressure pad. The force thus measured is indicative for the pressure exerted on the modeling material within the layer being deposited.

Figure 6D:
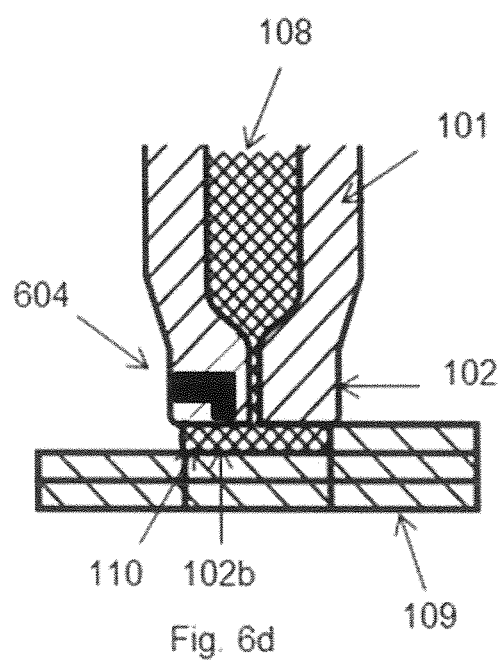

As shown in FIGS. 6a-6d, alternatively to measuring the pressure exerted on the modeling material 108 within the printhead 121, as described in relation to FIG. 4a, i.e. the torque of the rotary drive 104 and transmission system 105a, 105b or force at the plunger 103 can be measured which torque and force represent the pressure exerted on the modeling material 108 within the tubular feed member 101 as a second parameter. Moreover, the pressure exerted on the modeling material 108 within the tubular feed member 101, i.e. the feed channel section 120a can be measured directly, as shown in FIG. 6a. The pressure measured by the pressure sensor 601 can be used for controlling the rotary drive 104 in order to obtain a pressure suitable for printing the modeling material into the track 110 to be deposited.

An alternative placement of pressure sensor 602 is shown in FIG. 6b, wherein the pressure sensor 602 is placed within the nozzle 102 and wherein the pressure is sensed of the feed channel section 120b within the nozzle 102. An alternative for measuring the pressure within the feed channel 120b is to measure deformation of the nozzle 102 or nozzle tip 102b using for example a strain gauge 603 disposed around the feed channel section 120b.

An alternative to measuring the pressure within the feed channel 120a, 120b, is to have a pressure sensor 604 as shown in FIG. 6d, which is arranged within the nozzle 102 and which is fluidly connected to the nozzle tip 102b. The pressure measured at the nozzle tip 102b represents the pressure exerted on the modeling material track 110. This way an alternative third parameter for establishing a pressure exerted on the modeling material within track 110 relative to FIG. 5 is provided.

Pressure sensors suitable for use in a three-dimensional modeling system as described above for measuring pressure within the printhead 121, comprise membrane sensors which have a deformable membrane. A liquid such as mercury may transfer the pressure within the modeling material channel wherein pressure is to be measured, i.e. the feed channel 120a, 120b, or at the nozzle tip 102b to the membrane. The sensor itself may be of a type including a thin film metal sensor, a conductor/strain gauge related sensor, a piezoelectric sensor, magneto-resistive sensor, laser interferometer sensor and sensor based on mechanical displacement.

As shown in FIGS. 6a-6d, the track 110 can be deposited next to a previously deposited track 109 using pressure control for forming a continuous track of deposited modeling material. The modeling material of track 110 will flow to the previously deposited track by the pressure exerted on it via the nozzle outlet 102a and fuse with the previously deposited material. In FIGS. 7a-7c an alternative strategy is shown for deposition of tracks of modeling material 108 using pressure control.

A first track 701 is deposited, using flow or pressure control as shown in FIG. 7a. In FIG. 7b a second track 702 is shown being deposited spaced apart from the first track 701 wherein in the space between the first track 701 and the second track 702 a third or intermediate track 703 can be printed. In FIG. 7c the third track 703 is shown being printed between tracks 701 and 702 using pressure control. The modeling material fills the open space between the first track 701 and the second track 702 and fuses with these previously deposited tracks 701,702, such that the tracks 701-703 form a continuous layer without gaps or cavities.

In FIGS. 8a, 8b a refinement of the printing strategy is shown, wherein a first stack of tracks 801 is deposited using flow control. Adjacent tracks 802a, 802b having a coarser deposition profile can be deposited as an infill using pressure control.

The control system for flow control 112 and pressure control 412 may be accommodated in a programmable logic controller (PLC), a microcontroller or processor having a memory (RAM, ROM, EPROM, etc.) comprising program instructions, which in operation cause the processor to perform the controlling of flow and pressure as described.

The program instruction may comprise modules for calculating pressures exerted on the modeling material 108 from these indicative forces and torques as described. Moreover, losses due to friction and other causes within the rotary drive 104, transmission gear 105a, 105b, modeling material tubular feed member 101 and nozzle 102 may be calculated and used to compensate or correct the control loops 412 as described.

It will be clear to a person skilled in the art that the scope of the present invention is not limited to the examples discussed in the foregoing but that several amendments and modifications thereof are possible without deviating from the scope of the present invention as defined by the attached claims. In particular, combinations of specific features of various aspects of the invention may be made. An aspect of the invention may be further advantageously enhanced by adding a feature that was described in relation to another aspect of the invention. While the present invention has been illustrated and described in detail in the figures and the description, such illustration and description are to be considered illustrative or exemplary only, and not restrictive.

The present invention is not limited to the disclosed embodiments. Variations to the disclosed embodiments can be understood and effected by a person skilled in the art in practicing the claimed invention, from a study of the figures, the description and the attached claims. In the claims, the word "comprising" does not exclude other steps or elements, and the indefinite article "a" or "an" does not exclude a plurality. The mere fact that certain measures are recited in mutually different dependent claims does not indicate that a combination of these measures cannot be used to advantage. Any reference numerals in the claims should not be construed as limiting the scope of the present invention.

REFERENCE NUMERALS

100 Three-dimensional modeling system
101 Tubular feed member
102 Nozzle
102a Nozzle outlet
102b Nozzle tip
103 Plunger
104 Rotary drive
105a, 105b Transmission gear
106 Gantry
107 Interconnection
108 Modeling material
109 Previously deposited tracks
110 Deposited FDM track
110a New track of modeling material
110b Incompletely dispensed track of modeling material
110c Over-extruded track of modeling material
110d Track of modeling material deposited in tight fitting 110e Track of modeling material broader than the previously deposited tracks
111 Displacement sensor
112 Flow control system
113 Drive system
114 Flow regulator module
115 Subtraction unit
120a, 120b Feed channel
121 Three-dimensional modeling printhead
400 Three-dimensional modeling system for pressure control within the printhead
401 Torque sensor
402 Pressure regulation module
403 Subtractor
412 Control system for pressure control
500 Three-dimensional modeling system for pressure control at nozzle tip
501 Displacement sensor
502 Resilient connection member
503 XYZ positioning system
601-604 Pressure sensor
701 First track
702 Second track
703 Third or intermediate track using pressure control
801 First stack of tracks
802a-802b Adjacent tracks
'S' Flow setpoint
'X' Displacement per time unit
$P_R$ Pressure setpoint or reference value
$P_M$ Measured parameter indicative of the pressure
'$H_1$' Flow control transfer function
'$H_2$' Pressure control transfer function

What is claimed is:

1. A three-dimensional modeling system for creating a three-dimensional object comprising:
    a three-dimensional modeling printhead;
    the printhead being attached to positioning means for spatially moving at least one of the printhead and to the object being printed relative to one another;
    the printhead comprising:
        a tubular feed member;
        a nozzle arranged at one end of the tubular feed member, the nozzle having a nozzle outlet and a nozzle tip for interfacing previously deposited tracks of modeling material on the object to be created;
        the tubular feed member comprising a feed channel for feeding modeling material to the nozzle outlet;
    the system further comprising modeling material feeding means arranged at an end of the tubular feed member opposite of the nozzle, wherein the modeling material feeding means are arranged for exerting a pressure on the modeling material within the feed channel towards the nozzle;
    the system further comprising pressure determining means for determining a first parameter ($P_M$) indicative for a pressure exerted on the modeling material;
    the system further comprising a control system arranged for controlling the modeling material feeding means based on said determined first parameter ($P_M$) indicative for a pressure exerted on the modeling material;
    wherein the control system is arranged for controlling the positioning means and the printhead for
        depositing two first tracks, wherein said two first tracks are spaced apart, and
        depositing an intermediate track between said two first tracks while controlling the pressure exerted on the modeling material using said first parameter ($P_M$) indicative for a pressure exerted on the modeling material,
    wherein the pressure determining means for determining said first parameter ($P_M$) indicative for the pressure exerted on the modeling material further comprises pressure determining means for determining a second parameter indicative of a pressure exerted on the modeling material within the feed channel.

2. The system according to claim 1, wherein the control system is arranged for controlling the modeling material feeding means to maintain said first parameter ($P_M$), indicative for a pressure exerted on the modeling material, between a predetermined minimum pressure value and a predetermined maximum pressure value.

3. The system according to claim 1, wherein the control system is arranged for maintaining said first parameter ($P_M$) indicative for a pressure exerted on the modeling material at a constant value.

4. The system according to claim 1, wherein the modeling material feeding means comprise a controllable drive and transmission means for transferring a driving force generated by the drive to the modeling material.

5. The system according to claim 1, wherein the modeling material feeding means comprises a controllable drive, wherein the controllable drive comprises a rotary drive, and wherein pressure determining means for determining said second parameter indicative of the pressure exerted on the modeling material within the feed channel comprise torque determining means for determining a torque exerted by the rotary drive and/or transmission system.

6. The system according to claim 5, wherein the controllable drive comprises an electric motor, and wherein the torque determining means comprise motor current measuring means.

7. The system according to claim 1, wherein the modeling material feeding means comprises a plunger for feeding modeling material rods into the tubular feed member, and wherein the pressure determining means for determining said second parameter indicative of the pressure exerted on the modeling material within the feed channel comprise a pressure sensor, arranged at the plunger for measuring the pressure exerted by the plunger on the modeling material.

8. The system according to claim 1, wherein the pressure determining means for determining said second parameter indicative of the pressure exerted on the modeling material within the feed channel comprise a pressure sensor connected to the feed channel of the tubular feed member.

9. The system according to claim 8, wherein the pressure determining means for determining said second parameter indicative of the pressure exerted on the modeling material within the feed channel comprise a pressure sensor connected to feed channel at the nozzle.

10. The system according to claim 9, wherein the pressure determining means comprise a nozzle deformation sensor.

11. A method of three-dimensional modeling for creating a three-dimensional object, comprising:
    performing three-dimensional modeling the three-dimensional object using the system for three-dimensional modeling according to claim 1, comprising:
    feeding the modeling material using the modeling material feeding means;
    determining a first parameter ($P_M$) indicative of a pressure exerted on the modeling material;
    controlling the modeling material feeding means depending on said first parameter ($P_M$) indicative of the pressure exerted on the modeling material;

depositing two first tracks of three-dimensional modeling material, wherein said two first tracks are spaced apart; and depositing an intermediate track between said two first tracks while controlling the pressure exerted on the modeling material using said first parameter ($P_M$) indicative for a pressure exerted on the modeling material.

12. The method according to claim 11, wherein the controlling the modeling material feeding means depending on said first parameter ($P_M$) indicative of the pressure exerted on the modeling material comprises:

comparing said first parameter ($P_M$) indicative of the pressure exerted on the modeling material with a reference value ($P_R$); and wherein the controlling is based on a difference between said first parameter ($P_M$) and the reference value ($P_R$).

13. The method according to claim 12, wherein controlling the modeling material feeding means depending on said first parameter ($P_M$) indicative of the pressure exerted on the modeling material comprises:

maintaining said first parameter ($P_M$) indicative of the pressure exerted on the modeling material between a previously determined minimum pressure value and a previously determined maximum pressure value.

14. The method according to claim 13, wherein the controlling the modeling material feeding means depending on said first parameter ($P_M$) indicative of the pressure exerted on the modeling material comprises:

maintaining said first parameter ($P_M$) indicative of the pressure exerted on the modeling material at a previously determined constant value.

15. The method according to claim 11, wherein the determining said first parameter ($P_M$) indicative of a pressure exerted on the modeling material comprises determining a second parameter indicative of a pressure exerted on the modeling material within the feed channel of the tubular feed member and/or nozzle.

16. A three-dimensional modeling system for creating a three-dimensional object comprising:

a three-dimensional modeling printhead;

the printhead being attached to positioning means for spatially moving at least one of the printhead and to the object being printed relative to one another;

the printhead comprising:
a tubular feed member;
a nozzle arranged at one end of the tubular feed member, the nozzle having a nozzle outlet and a nozzle tip for interfacing previously deposited tracks of modeling material on the object to be created;
the tubular feed member comprising a feed channel for feeding modeling material to the nozzle outlet;

the system further comprising modeling material feeding means arranged at an end of the tubular feed member opposite of the nozzle, wherein the modeling material feeding means are arranged for exerting a pressure on the modeling material within the feed channel towards the nozzle;

the system further comprising pressure determining means for determining a first parameter ($P_M$) indicative for a pressure exerted on the modeling material;

the system further comprising a control system arranged for controlling the modeling material feeding means based on said determined first parameter ($P_M$) indicative for a pressure exerted on the modeling material;

wherein the control system is arranged for controlling the positioning means and the printhead for depositing two first tracks, wherein said two first tracks are spaced apart, and depositing an intermediate track between said two first tracks while controlling the pressure exerted on the modeling material using said first parameter ($P_M$) indicative for a pressure exerted on the modeling material, wherein the pressure determining means for determining said first parameter ($P_M$) indicative of a pressure exerted on the modeling material comprise pressure determining means for determining a third parameter indicative of a pressure exerted on the modeling material within the intermediate track being deposited.

17. The system according to claim 16, wherein the pressure determining means for determining said third parameter indicative of a pressure exerted on the modeling material within the intermediate track being deposited comprise a pressure sensor having a fluid channel at the nozzle tip for measuring a pressure in the deposited modeling material at the nozzle tip.

18. The system according to claim 16, wherein the pressure determining means for determining said third parameter indicative of a pressure exerted on the modeling material within the intermediate track being deposited comprise a force sensor arranged between the printhead and the positioning means.

19. The system according to claim 18, wherein the force sensor is arranged at an interconnection of the printhead and the positioning means.

20. The system according to claim 16, wherein the pressure determining means for determining said third parameter indicative of a pressure exerted on the modeling material within the intermediate track being deposited comprises a force sensor arranged on a base, which is arranged for receiving the object to be created.

21. The system according to claim 16, wherein the control system is arranged for controlling the modeling material feeding means to maintain said first parameter ($P_M$), indicative for a pressure exerted on the modeling material, between a predetermined minimum pressure value and a predetermined maximum pressure value.

22. The system according to claim 16, wherein the control system is arranged for maintaining said first parameter ($P_M$) indicative for a pressure exerted on the modeling material at a constant value.

23. The system according to claim 16, wherein the modeling material feeding means comprise a controllable drive and transmission means for transferring a driving force generated by the drive to the modeling material.

24. A method of three-dimensional modeling for creating a three-dimensional object, comprising:

performing three-dimensional modeling the three-dimensional object using the system for three-dimensional modeling according to claim 16, comprising:

feeding the modeling material using the modeling material feeding means;

determining a first parameter ($P_M$) indicative of a pressure exerted on the modeling material;

controlling the modeling material feeding means depending on said first parameter ($P_M$) indicative of the pressure exerted on the modeling material;

depositing two first tracks of three-dimensional modeling material, wherein said two first tracks are spaced apart; and depositing an intermediate track between said two first tracks while controlling the pressure exerted on the modeling material using said first parameter ($P_M$) indicative for a pressure exerted on the modeling material.

25. The method according to claim 24, wherein the controlling the modeling material feeding means depending on said first parameter ($P_M$) indicative of the pressure exerted on the modeling material comprises:
   comparing said first parameter ($P_M$) indicative of the pressure exerted on the modeling material with a reference value ($P_R$); and
   wherein the controlling is based on a difference between said first parameter ($P_M$) and the reference value ($P_R$).

26. The method according to claim 25, wherein controlling the modeling material feeding means depending on said first parameter ($P_M$) indicative of the pressure exerted on the modeling material comprises:
   maintaining said first parameter ($P_M$) indicative of the pressure exerted on the modeling material between a previously determined minimum pressure value and a previously determined maximum pressure value.

27. The method according to claim 26, wherein the controlling the modeling material feeding means depending on said first parameter ($P_M$) indicative of the pressure exerted on the modeling material comprises:
   maintaining said first parameter ($P_M$) indicative of the pressure exerted on the modeling material at a previously determined constant value.

28. The method according to claim 24, wherein the determining said first parameter ($P_M$) indicative of a pressure exerted on the modeling material comprises determining a third parameter indicative of a pressure exerted on the modeling material within the track being deposited.

29. A three-dimensional modeling system for creating a three-dimensional object comprising:
   a three-dimensional modeling printhead;
   the printhead being attached to positioning means for spatially moving at least one of the printhead and to the object being printed relative to one another;
   the printhead comprising:
      a tubular feed member;
      a nozzle arranged at one end of the tubular feed member, the nozzle having a nozzle outlet and a nozzle tip for interfacing previously deposited tracks of modeling material on the object to be created;
      the tubular feed member comprising a feed channel for feeding modeling material to the nozzle outlet;
   the system further comprising modeling material feeding means arranged at an end of the tubular feed member opposite of the nozzle, wherein the modeling material feeding means are arranged for exerting a pressure on the modeling material within the feed channel towards the nozzle;
   the system further comprising pressure determining means for determining a first parameter ($P_M$) indicative for a pressure exerted on the modeling material;
   the system further comprising a control system arranged for controlling the modeling material feeding means based on said determined first parameter ($P_M$) indicative for a pressure exerted on the modeling material;
   wherein the control system is arranged for controlling the positioning means and the printhead for
      depositing two first tracks each having a first width, wherein said two first tracks are spaced apart by a gap having a second width, said second width being substantially equal to the first width, and
   depositing an intermediate track in said gap between said two first tracks while controlling the pressure exerted on the modeling material using said first parameter ($P_M$) indicative for a pressure exerted on the modeling material.

30. A method of three-dimensional modeling for creating a three-dimensional object, comprising:
   performing three-dimensional modeling the three-dimensional object using the system for three-dimensional modeling according to claim 29, comprising:
   feeding the modeling material using the modeling material feeding means;
   determining a first parameter ($P_M$) indicative of a pressure exerted on the modeling material;
   controlling the modeling material feeding means depending on said first parameter ($P_M$) indicative of the pressure exerted on the modeling material;
   depositing two first tracks of three-dimensional modeling material each having a first width, wherein said two first tracks are spaced apart by a gap having a second width, said second width being substantially equal to the first width; and
   depositing an intermediate track in said gap between said two first tracks while controlling the pressure exerted on the modeling material using said first parameter ($P_M$) indicative for a pressure exerted on the modeling material.

* * * * *